(12) United States Patent
Liu et al.

(10) Patent No.: US 8,399,879 B2
(45) Date of Patent: Mar. 19, 2013

(54) NANO-WIRE FIELD EFFECT TRANSISTOR, METHOD FOR MANUFACTURING THE TRANSISTOR, AND INTEGRATED CIRCUIT INCLUDING THE TRANSISTOR

(75) Inventors: Yongxun Liu, Tsukuba (JP); Takashi Matsukawa, Tsukuba (JP); Kazuhiko Endo, Tsukuba (JP); Shinichi Ouchi, Tsukuba (JP); Kunihiro Sakamoto, Tsukuba (JP); Meishoku Masahara, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 166 days.

(21) Appl. No.: 12/993,880

(22) PCT Filed: Jun. 5, 2009

(86) PCT No.: PCT/JP2009/060318
§ 371 (c)(1),
(2), (4) Date: Nov. 22, 2010

(87) PCT Pub. No.: WO2009/151001
PCT Pub. Date: Dec. 17, 2009

(65) Prior Publication Data
US 2011/0073842 A1    Mar. 31, 2011

(30) Foreign Application Priority Data
Jun. 9, 2008 (JP) ................................. 2008-150547

(51) Int. Cl.
| H01L 29/06 | (2006.01) |
| H01L 31/072 | (2012.01) |
| H01L 31/019 | (2006.01) |
| H01L 31/0328 | (2006.01) |
| H01L 31/0336 | (2006.01) |

(52) U.S. Cl. .................... 257/24; 257/E21.073; 438/149
(58) Field of Classification Search .................... 257/24, 257/E21.703, E29.273; 438/149
See application file for complete search history.

(56) References Cited

U.S. PATENT DOCUMENTS
7,274,051 B2    9/2007    Kim et al.
(Continued)

FOREIGN PATENT DOCUMENTS
JP    06-188432    7/1994
JP    2002-270850    9/2002

OTHER PUBLICATIONS

High-performance 5nm radius Twin Silicon Nanowire MOSFET (TSNWFET): Fabrication on Bulk Si Wafer, Characteristics, and Reliability; Sung Dae Suk et al.; 2005 IEEE. 5nm-Gate Nanowire FinFET; Fu-Liang Yang et al.; 2004 Symposium on VSLI Technology Digest of Technical Papers; pp. 196-197.

(Continued)

*Primary Examiner* — Phuc Dang
(74) *Attorney, Agent, or Firm* — Bacon & Thomas, PLLC

(57) ABSTRACT

Provided is a method for fabricating a nano-wire field effect transistor including steps of: preparing an SOI substrate having a (100) surface orientation, and nano-wire field effect transistor where two triangular columnar members configuring the nano-wires and being made of a silicon crystal layer are arranged one above the other on an SOI substrate having a (100) surface such a way that the ridge lines of the triangular columnar members face via an insulator; processing the silicon crystal configuring the SOI substrate into a standing plate-shaped member having a rectangular cross-section; and as a nanowire, processing the silicon crystal by orientation dependent wet etching into a shape where two triangular columnar members are arranged one above the other in such a way that the ridge lines of the triangular columnar members configuring the nano-wires face through the ridge lines thereof, and an integrated circuit including the nano-wire field effect transistor.

6 Claims, 16 Drawing Sheets

A-A' Cross-sectional View

U.S. PATENT DOCUMENTS

| | | | |
|---|---|---|---|
| 7,374,986 B2 | 5/2008 | Kim et al. | |
| 8,080,481 B2 * | 12/2011 | Lee et al. | 438/758 |
| 2005/0227403 A1 * | 10/2005 | Muramatsu | 438/57 |
| 2007/0029623 A1 | 2/2007 | Liu et al. | |
| 2007/0105321 A1 | 5/2007 | Lee et al. | |

OTHER PUBLICATIONS

FinFET—A Self-Aligned Double-Gate MOSFET Scalable to 20nm; Digh Hisamoto et al.; IEEE Transactions on Electron Devices, vol. 47, No. 12, Dec. 2000; pp. 2320-2325.

* cited by examiner

Plan View

A-A' Cross-sectional View

B-B' Cross-sectional View

Plan View

A-A' Cross-sectional View

B-B' Cross-sectional View

Plan View

A-A' Cross-sectional View

B-B' Cross-sectional View

Plan View

A1-A1' Cross-sectional View  A2-A2' Cross-sectional View

B-B' Cross-sectional View

Plan View

A1-A1' Cross-sectional View      A2-A2' Cross-sectional View

B-B' Cross-sectional View

Plan View

A1-A1' Cross-sectional View    A2-A2' Cross-sectional View

B-B' Cross-sectional View

Plan View

A-A' Cross-sectional View

B-B' Cross-sectional View

Plan View

A-A' Cross-sectional View

B-B' Cross-sectional View

Plan View

A-A' Cross-sectional View

B-B' Cross-sectional View

Plan View

A-A' Cross-sectional View

B-B' Cross-sectional View

Plan View

A-A' Cross-sectional View

B-B' Cross-sectional View

NANO-WIRE FIELD EFFECT TRANSISTOR, METHOD FOR MANUFACTURING THE TRANSISTOR, AND INTEGRATED CIRCUIT INCLUDING THE TRANSISTOR

TECHNICAL FIELD

The present invention relates a nano-wire field effect transistor, a method for manufacturing the transistor, and an integrated circuit including the transistor.

BACKGROUND ART

Silicon integrated circuits have been progressed in enlarging the scale as well as in improving the performance according to so-called Moore's rule, and supported the development of the advanced information technology (IT) society from an aspect of the hardware. This trend is expected to be continued also in future. However, it is deeply concerned that miniaturization of the conventional bulk type CMOS integrated circuit will reach its limit in near future. Its main reasons are an increase in leakage current due to the miniaturization of the transistor, a degradation in switching property of the transistor (an increase in the sub-threshold slope) and so on. In other word, a serious problem lies in that the more technology node progresses, the more percentage of ineffective power consumption due to the leakage current rather than the operating power increases.

In order to overcome this essential difficulty, the ITRS road map has declared an introduction of an ultra-thin body, fully depleted SOI (Silicon-On-Insulator) device, double-gate/multi-gate MOSFET and so on in an early stage of the decade from 2010 year. Especially, an attention has been directed towards a Fin type double gate MOSFET (FinFET) having a standing, lateral channel (Refer to Non Patent Document 1) as a promising candidate device after the 32 nm node since a fabrication process of a self-aligned double gate structure is simple.

In the conventional Fin type double gate MOS field effect transistor structure (Non Patent Document 1) shown in FIGS. 34, 35 and 36, a standing Si Fin channel 50 is sandwiched by gate materials 3 so that the potential of the channel is strongly controlled by the gate electrode arranged on both sides of the Fin channel. Therefore, such a double gate structure is effective for suppressing a leakage current between the source 7-1 and the drain 7-2. However, with miniaturization of a device size, micro fabrication of the Fin channel becomes difficult. Also with shortening of the gate length, a degradation of the sub-threshold slope due to the short channel effect becomes more serious.

In the four terminal Fin type MOS field effect transistor structure (Refer to Patent Document 1) in which gate electrodes 30-1 and 30-2 are physically separated and electrically isolated as shown in FIGS. 37, 38 and 39, gate insulator films 60-1 and 60-2 are formed at the same time on both sides of the channel so that the two gate insulator films on both sides of the channel 50 have a same thicknesses ($t_1 = t_2$). This transistor can be operated by applying a fixed potential to one gate and applying a driving input signal to the other gate. By changing the fixed potential value, the threshold voltage of the transistor can certainly be controlled, but this causes a significant increase in the sub-threshold slope.

To solve this problem, a four terminal Fin type MOS field effect transistor having asymmetric thicknesses ($t_1 < t_2$) of the gate insulator films 60-1 and 60-3 as shown in FIGS. 40, 41 and 42 is proposed (Refer to Patent Document 2). In this device structure, by setting the thickness of the insulator film of the controlling gate thicker than that of the insulator film of the driving gate, the problem of a significant increase in the sub-threshold slope can be solved, and at the same time the threshold voltage can be controlled.

However, for the conventional Fin type MOS field effect transistor described above, the short channel effect, difficulties in forming a narrow channel and so on according to the device miniaturization are not taken into consideration. To solve these problems, a silicon nano-wire field effect transistor such as shown in FIGS. 43, 44, 45, 46, 47 and 48 is proposed (Refer to Non Patent Document 2, 3).

Features of such a device structure include a channel having a nanometer sized circular cross-section, and a gate electrode covering all around the side surface of the channel. This structure has, therefore, a stronger controllability of the channel potential by the gate, and is more effective in suppressing the short channel effect compared with the FinFET. In addition, it gives some retardation in channel miniaturization, i.e., the dimension of the channel can be favorably larger than the gate length. However, a fabrication process thereof is extremely complicated. Furthermore, in order to increase driving current, nano-wires each having a circular cross-section have to be arranged laterally, which results in larger area penalty. Moreover, since nano-wires each having a circular cross-section are fabricated by high temperature hydrogen annealing, serious problems are still remained in uniformity, controllability, and reproducibility of the nano-wire dimension. Therefore, if a high density integrated circuit is fabricated by using such a nano-wire field effect transistor, it becomes difficult to realize a high performance, and high reliability integrated circuit due to significant variation of device characteristics on a same wafer.

Patent Document 1: Japanese Patent Application Publication No. 2002-270850.
Patent Document 2: Japanese Patent Application Publication No. 2005-167163.
Non Patent Document 1: IEEE Trans. Electron Devices, Vol. 47. No. 12, pp. 2320-2325, 2000.
Non Patent Document 2: Symposium on VLSI Technology 2004, pp. 196-197.
Non Patent Document 3: Sung Dee Suk, et al., IEDM Tech. Dig., pp. 735-738, 2005

DISCLOSURE OF INVENTION

Problems to be Solved by the Invention

The object of the present invention is to solve the above problem for the conventional nano-wire field effect transistor and to increase the driving current without increasing in device area.

Solutions to Solve the Problems

The above problems can be solved by following means.
(1) A nano-wire field effect transistor, characterized in that an even number of triangular columnar members configuring the nano-wires (also referred to as "nano-wire with a triangular cross-section" in this description) and being made from a silicon crystal layer on an SOI (Silicon-On-Insulator) substrate having a (100) surface orientation are arranged one above the other in such a way that the ridge lines of the triangular columnar members face through an insulator.
(2) The nano-wire field effect transistor in accordance with the above description (1), characterized in that a plurality sets of the even number of triangular columnar members are arranged in parallel.

(3) The nano-wire field effect transistor in accordance with the above description (1) or (2), characterized in that a gate electrode is provided to surround the triangular columnar member via a gate insulator film.

(4) The nano-wire field effect transistor in accordance with the above description (1), characterized in that an independent gate electrode is provided on both sides of the triangular columnar member via a gate insulator film.

(5) The nano-wire field effect transistor in accordance with any one of the above descriptions (1) to (4), characterized in that the side surface of the triangular columnar member has a (111) surface orientation.

(6) An integrated circuit including the nano-wire field effect transistor in accordance with any one of the above descriptions (1) to (5).

(7) The integrated circuit in accordance with the above description (6), further including a nano-wire field effect transistor which lacks an upper triangular columnar member among the even number of triangular columnar members configuring the nano-wires.

(8) A manufacturing method of the nano-wire field effect transistor comprising steps of:

preparing an SOI (Silicon-On-Insulator) substrate having a (100) surface orientation;

processing a silicon crystal configuring the SOI substrate into a standing plate-shaped member having a rectangular cross-section; and processing the silicon crystal by orientation dependent wet etching into a shape where two triangular columnar members configuring the nano-wires are arranged one above the other in such a way that the ridge lines of the triangular columnar members face.

(9) A manufacturing method of the nano-wire field effect transistor comprising steps of:

preparing an SOI (Silicon-On-Insulator) substrate having a (100) surface orientation and including two or more SOI layers and buried oxide films;

processing a silicon crystal configuring the SOI substrate into a standing plate-shaped member having a rectangular cross-section; and processing the silicon crystal by orientation dependent wet etching into a shape where a pair of triangular columnar members configuring the nano-wires are arranged one above the other in such a way that the ridge lines of the triangular columnar members face.

Effectiveness of the Invention

In the nano-wire field effect transistor in accordance with the present invention, there are provided two nano-wires each having with a triangular cross-section arranged one above the other on an SOI substrate having a (100) surface orientation. Therefore, the driving current of the transistor becomes twice as large as that of the conventional nano-wire field effect transistor with the same device area. In addition, by fabricating the nano-wire in the present invention by orientation dependent wet etching, the channel has a smooth surface with an atomic layer order which is superior in size reproducibility and uniformity. Therefore, the present invention can improve a size variation as well as characteristics variation in the conventional nano-wire having a circular cross-section formed by high temperature hydrogen annealing or thermal oxidation from a non-uniform silicon thin wire prepared by RIE (Reactive Ion Etching).

BEST MODE FOR CARRYING OUT THE INVENTION

Detailed descriptions will be given below by demonstrating some embodiments of the field effect transistors in accordance with the present invention. For convenience, a device fabricated by the gate-last-process; using a not-intentionally doped (non-doped) SOI (Silicon-On-Insulator) substrate having a (100) surface orientation, and forming two vertically symmetrical nano-wires each having a triangular cross-section simultaneously by reactive ion etching (RIE), and orientation dependent wet etching is described. However, a similar device can be fabricated by the gate-first-process. In the gate-first-process, an impurity ion is introduced to the source-drain regions by ion implantation after fabricating the gate pattern.

First Embodiment

Figure 1:
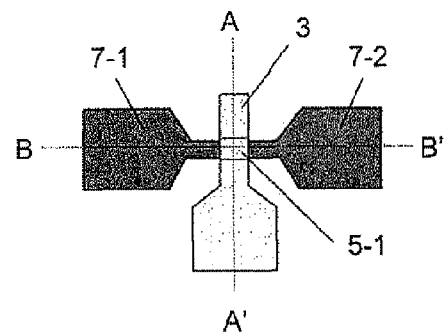
FIG. 1 is a plan view of a nano-wire field effect transistor in accordance with the first embodiment of the present invention.
Figure 2:
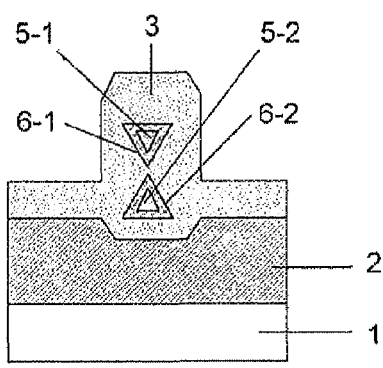
FIG. 2 is an A-A' cross-sectional view of FIG. 1.
Figure 3:
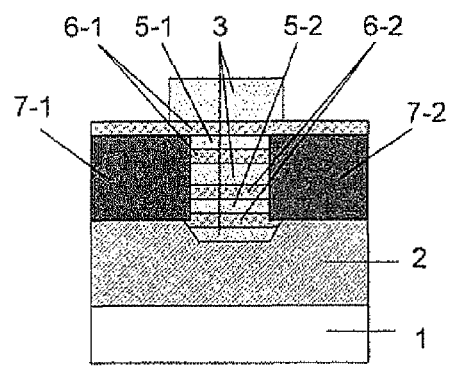
FIG. 3 is a B-B' cross-sectional view of FIG. 1.

FIGS. 1, 2 and 3 show the first embodiment in accordance with the present invention. FIG. 1 is a plan view of a nano-wire field effect transistor in accordance with the present invention, having two triangular columnar members configuring the nano-wires formed on a (100) SOI substrate. FIG. 2 is an A-A' cross-sectional view thereof, and FIG. 3 is a B-B' cross-sectional view thereof. In FIGS. 1 to 3, numeral reference 1 denotes a substrate, 2 denotes a buried oxide film, 3 denotes a gate electrode, 5-1 and 5-2 denote nano-wires each having a triangular cross-section simultaneously formed in a vertical direction. 6-1 and 6-2 denote gate insulator film, and 7-1 and 7-2 denote a source region and a drain region, respectively.

FIGS. 4 to 18 show an example of a fabrication process of the nano-wire field effect transistor in accordance with the first embodiment of the present invention. In FIGS. 4 to 18, Figure (A) shows an A-A' cross-sectional view, and Figure (B) shows a B-B' cross-sectional view.

Figure 4:
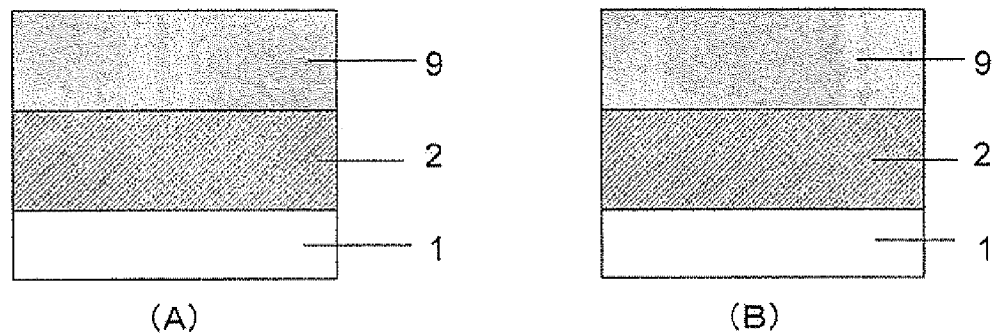
FIG. 4 is a fabrication process diagram of the nano-wire field effect transistor in accordance with the first embodiment of the present invention.

First, as shown in FIG. 4, an SOI wafer with a buried oxide film 2 and a silicon crystal layer 9 having a (100) surface orientation is prepared on a silicon substrate 1.

Figure 5:
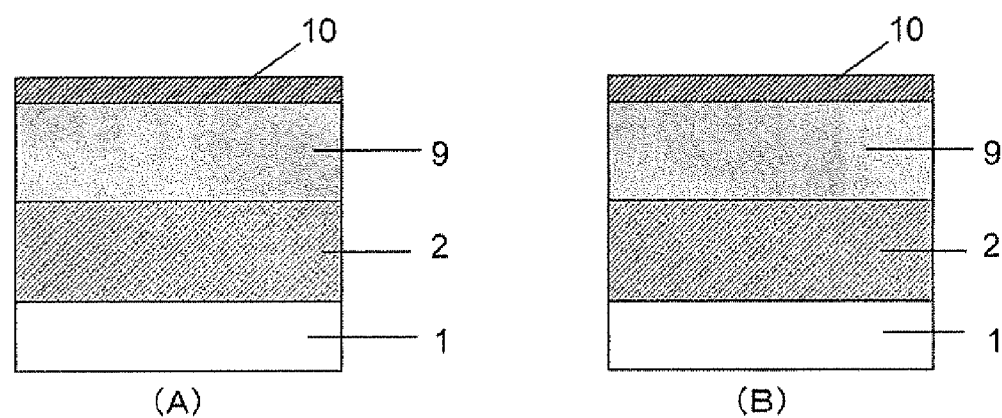
FIG. 5 is a fabrication process diagram of the nano-wire field effect transistor in accordance with the first embodiment of the present invention.
Figure 6:
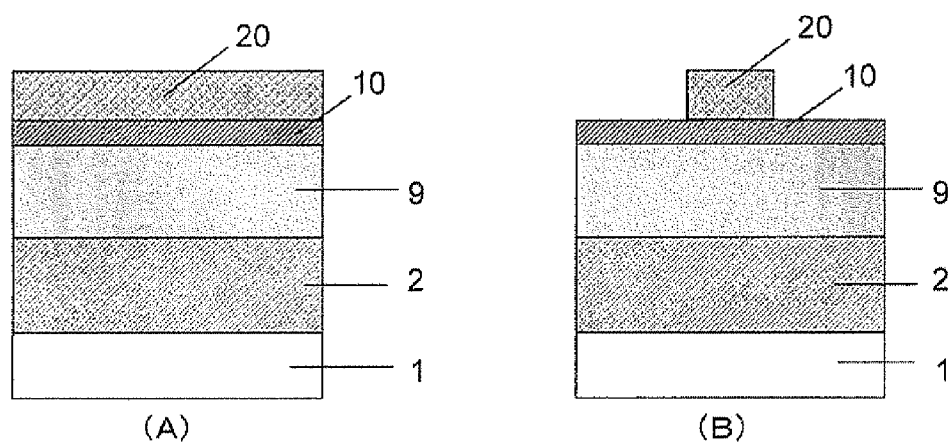
FIG. 6 is a fabrication process diagram of the nano-wire field effect transistor in accordance with the first embodiment of the present invention.
Figure 7:
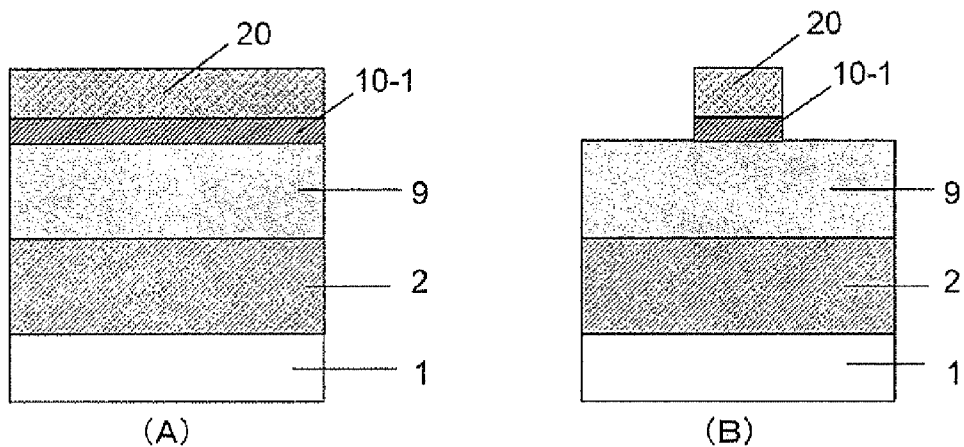
FIG. 7 is a fabrication process diagram of the nano-wire field effect transistor in accordance with the first embodiment of the present invention.

Next, an oxide film 10 is formed by utilizing a thermal oxidation, as shown in FIG. 5. Next, a resist pattern 20 is formed by electron beam lithography as shown in FIG. 6. Then the resist pattern 20 is transferred into the oxide film 10 to form a hard mask 10-1 by RIE, as shown in FIG. 7.

Figure 8:
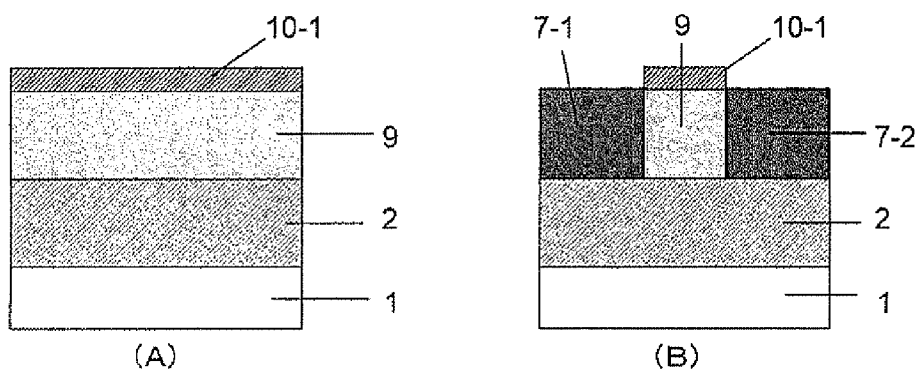
FIG. 8 is a fabrication process diagram of the nano-wire field effect transistor in accordance with the first embodiment of the present invention.

In the next step, a source region 7-1 and a drain region 7-2 are formed as shown in FIG. 8 by ion implantation with the resist pattern 20 and the hard mask 10-1 as protection films. After this step, the resist pattern is removed by oxygen plasma and an aqueous solution of such as sulfuric acid and hydrogen peroxide, and the oxide film hard mask 10-1 is removed by hydrofluoric acid. Such ion implantation process is performed twice; each for forming source-drain regions of a PMOS and for forming source-drain regions of an NMOS, respectively. In the ion implantation process, P or As is used as an ion species for an NMOS transistor, and B or $BF_2+$ is used as an ion species for a PMOS transistor.

Figure 9:
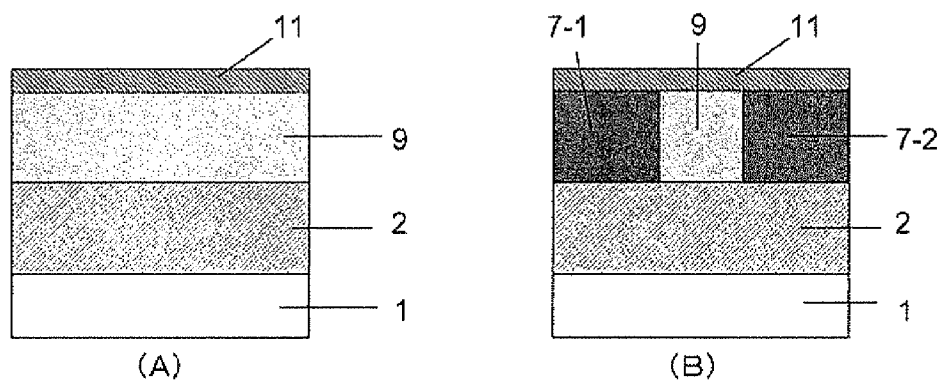
FIG. 9 is a fabrication process diagram of the nano-wire field effect transistor in accordance with the first embodiment of the present invention.
Figure 10:
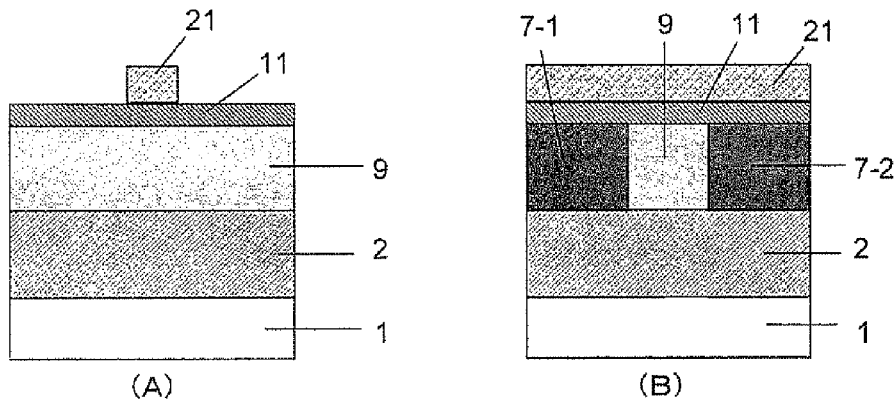
FIG. 10 is a fabrication process diagram of the nano-wire field effect transistor in accordance with the first embodiment of the present invention.
Figure 11:
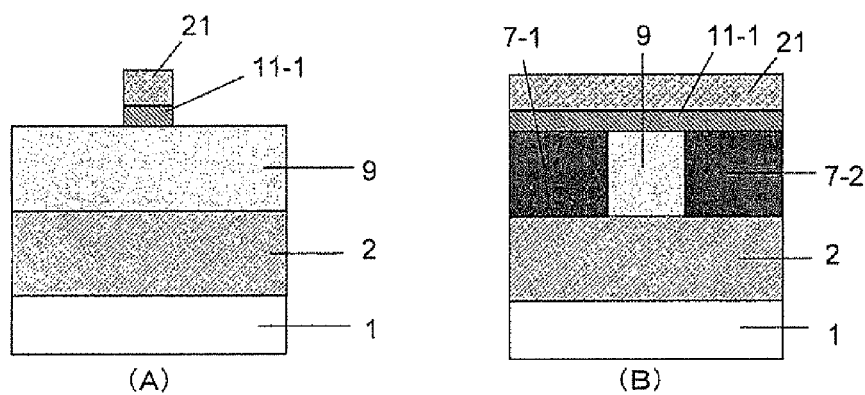
FIG. 11 is a fabrication process diagram of the nano-wire field effect transistor in accordance with the first embodiment of the present invention.

In the next step, a new CVD (Chemical Vapor Deposition) oxide film 11 is deposited as shown in FIG. 9. It is preferable to perform an annealing at a temperature T=850° C. in a nitrogen ambient for 2 minutes, since an etching rate of the CVD oxide film in a diluted hydrofluoric acid solution is too high. Next, a nanometer-sized resist pattern 21 is formed by electron beam lithography, as shown in FIG. 10. Then, the resist pattern 21 is transferred to the CVD oxide film 11 by RIE to form a hard mask 11-1, as shown in FIG. 11. The resist pattern 21 is then removed by oxygen plasma and an aqueous solution of such as sulfuric acid and hydrogen peroxide.

Figure 12:
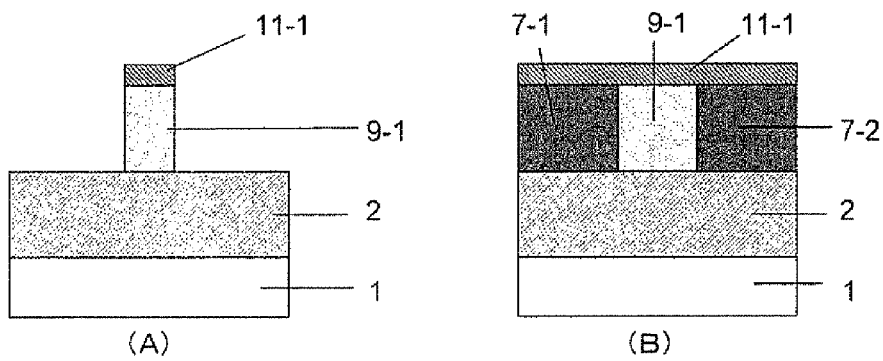
FIG. 12 is a fabrication process diagram of the nano-wire field effect transistor in accordance with the first embodiment of the present invention.

In the next step, the (100) SOI layer 9 is vertically etched by RIE using the hard mask 11-1 to form a silicon nano-wire 9-1 with a rectangular cross-section, as shown in FIG. 12. Then, a reaction product of the RIE is removed by oxygen plasma, and a cleaning is performed by an aqueous solution of such as sulfuric acid and hydrogen peroxide.

Figure 13:
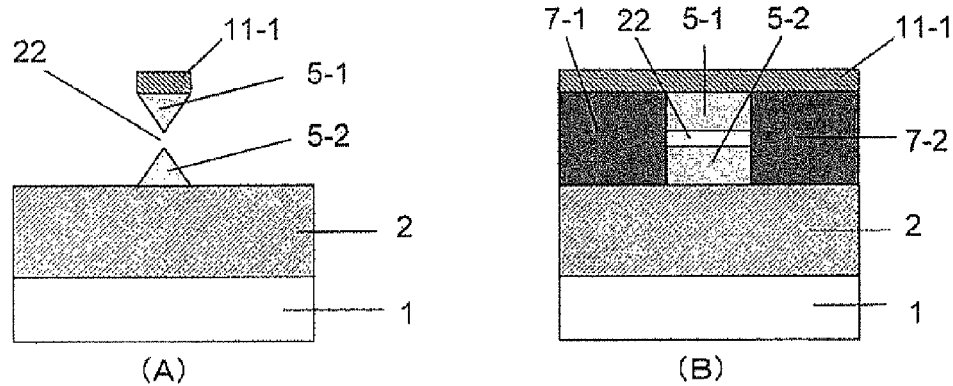
FIG. 13 is a fabrication process diagram of the nano-wire field effect transistor in accordance with the first embodiment of the present invention.
Figure 14:
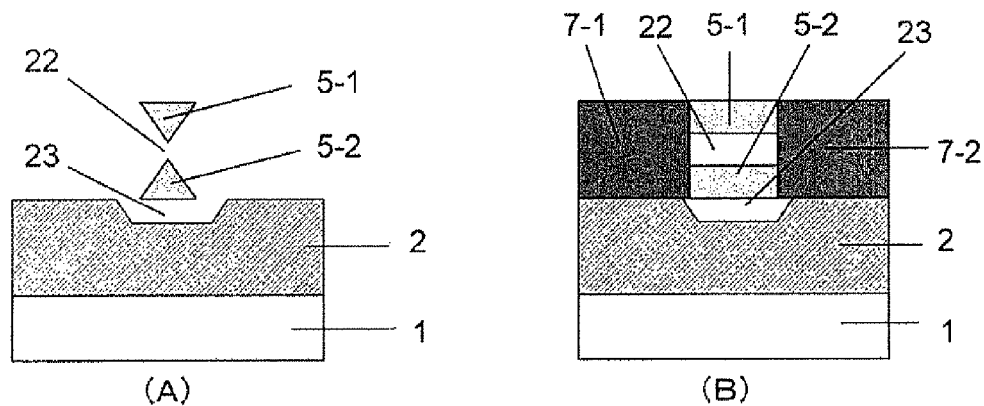
FIG. 14 is a fabrication process diagram of the nano-wire field effect transistor in accordance with the first embodiment of the present invention.

In the next step, as shown in FIG. 13, the width of the hard mask 11-1 is finely adjusted by using a diluted hydrofluoric acid solution. A pair of nano-wires each having a triangular cross-section 5-1 and 5-2 arranged one above the other are formed by orientation dependent wet etching of the rectangular silicon channel 9-1 from the side surfaces using an alkaline aqueous solution such as TMAH (Tetramethylammonium Hydroxide). The nano-wires each having a triangular cross-section are formed approximately with self alignment, since the surface orientation of both of the side surfaces of the nano-wires each having a triangular cross-section becomes (111) plane and the etching rate of this plane by TMAH is 1/40 smaller than that of a (110) plane. The etching time needs to be controlled precisely to prevent the nano-wire with a triangular cross-section from being over-etched. Whether a gap 22 is formed between the upper and the lower nano-wires each having a triangular cross-section or not depends on the width W of the hard mask 11-1 and the thickness H of the SOI. More specifically, in a case where W<H/tan 55° a gap 22 is formed, but not in a case where W>H/tan 55°. The former condition is adopted here. However, the latter condition is selected in a case where a separation between the upper and the lower nano-wires each having a triangular cross-section is performed in a thermal oxidation process in a later step. In the following step, as shown in FIG. 14, the hard mask 11-1 and the buried oxide film 2 under the nano-wire with a triangular cross-section 5-2 are etched by using a hydrofluoric acid solution, then a gap 23 is formed.

Figure 15:
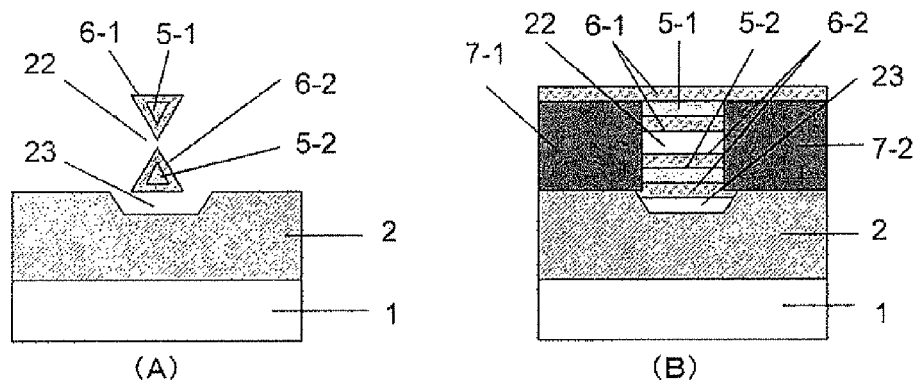
FIG. 15 is a fabrication process diagram of the nano-wire field effect transistor in accordance with the first embodiment of the present invention.
Figure 16:
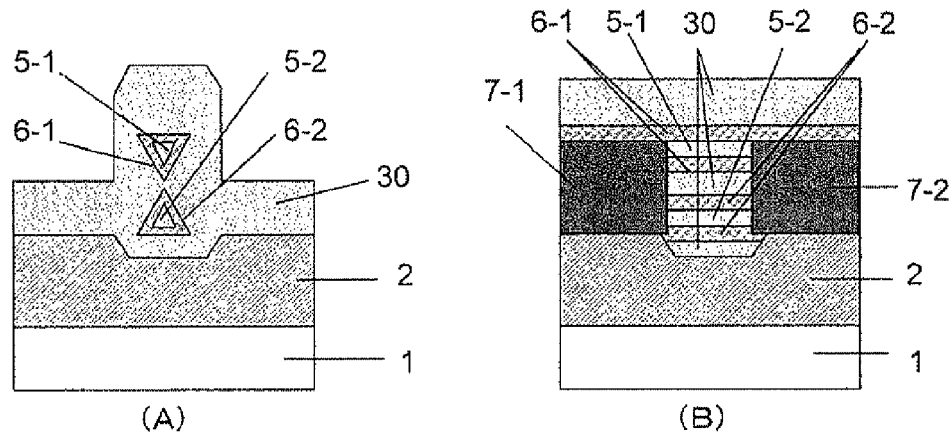
FIG. 16 is a fabrication process diagram of the nano-wire field effect transistor in accordance with the first embodiment of the present invention.
Figure 17:
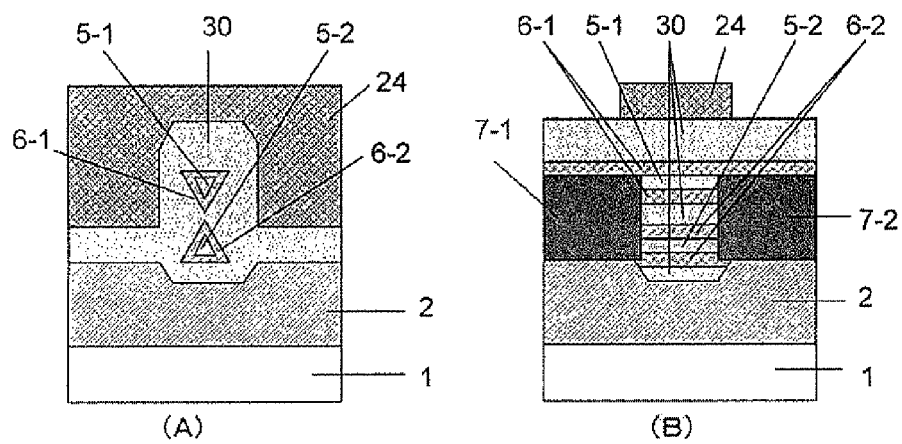
FIG. 17 is a fabrication process diagram of the nano-wire field effect transistor in accordance with the first embodiment of the present invention.

Next, gate oxide films 6-1 and 6-2 are formed by using a thermal oxidation as shown in FIG. 15. In this process, in place of the oxide film a high permittivity (high-k) material deposited by the CVD method may also be used as a gate insulator film. In the following step, a gate electrode material 30 is deposited, as shown in FIG. 16. As the gate electrode material, a poly-silicon or a refractory metal such as TiN, Mo, Ta/Mo alloy can be used. Next, a gate pattern 24 is formed by electron beam lithography, as shown in FIG. 17.

Figure 18:
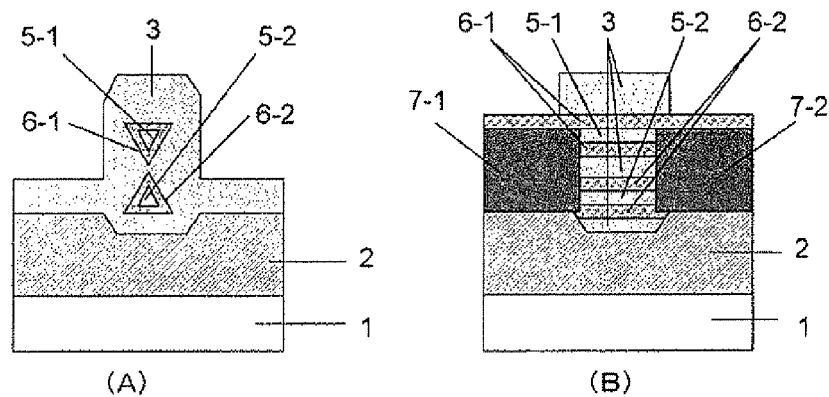
FIG. 18 is a fabrication process diagram of the nano-wire field effect transistor in accordance with the first embodiment of the present invention.

In the next step, as shown in FIG. 18, a gate electrode 3 is formed by etching the gate electrode material 30 by RIE. Then, a CVD oxide film is deposited, contact hole is opened, and an aluminum electrode is formed. These processes are omitted since they are similar to the fabrication process of the conventional integrated circuit. The fabrication of the nano-wire field effect transistor having two triangular columnar members configuring the nano-wires in accordance with the present invention is completed.

Second Embodiment

Figure 19:
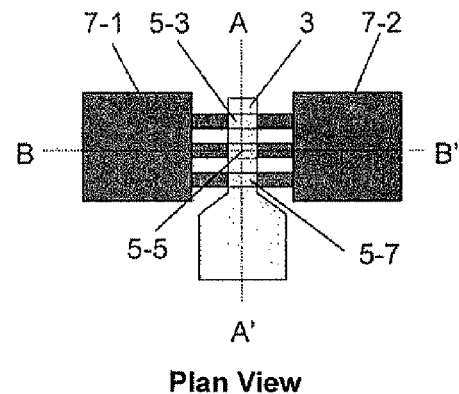
FIG. 19 is a plan view of a nano-wire field effect transistor in accordance with the second embodiment of the present invention.
Figure 20:
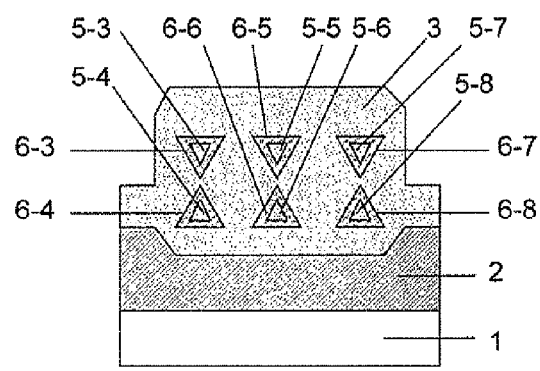
FIG. 20 is an A-A' cross-sectional view of FIG. 19.
Figure 21:
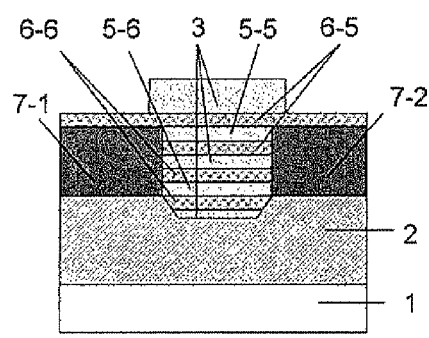
FIG. 21 is a B-B' cross-sectional view of FIG. 19.

FIGS. 19, 20 and 21 show the second embodiment of the present invention. FIG. 19 shows a plan view of a nano-wire field effect transistor in accordance with the present invention, where a plurality of pairs of triangular columnar members configuring the nano-wires are arranged in parallel. FIG. 20 shows an A-A' cross-sectional view thereof, and FIG. 21 shows a B-B' cross-sectional view thereof. In FIGS. 19 to 21, 1 denotes a substrate, 2 denotes a buried oxide film, 3 denotes a gate electrode, 5-3, 5-4, 5-5, 5-6, 5-7, and 5-8 denote nano-wires each having a triangular cross-section, 6-3, 6-4, 6-5, 6-6, 6-7, and 6-8 denote gate insulator films, and 7-1 and 7-2 denote source-drain regions.

A fabrication process of the second embodiment is basically the same as that of the first embodiment. A different point is that in the electron beam lithography process in the above paragraph 0018, a pattern of the nano-wire is formed in such a way that a plurality of pairs of nano-wires each having a triangular cross-section can be arranged. Other processes are the same as those of the first embodiment.

Third Embodiment

Figure 22:
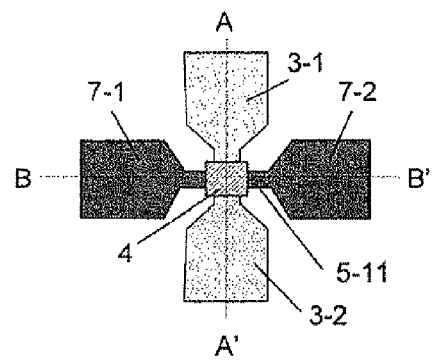
FIG. 22 is a plan view of a nano-wire field effect transistor in accordance with the third embodiment of the present invention.
Figure 23:
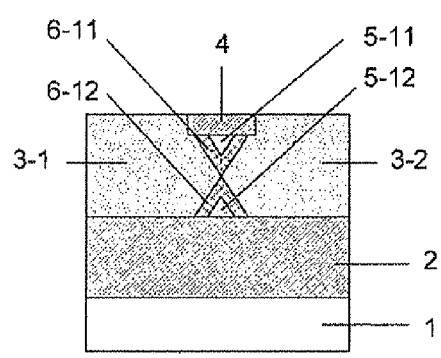
FIG. 23 is an A-A' cross-sectional view of FIG. 22.
Figure 24:
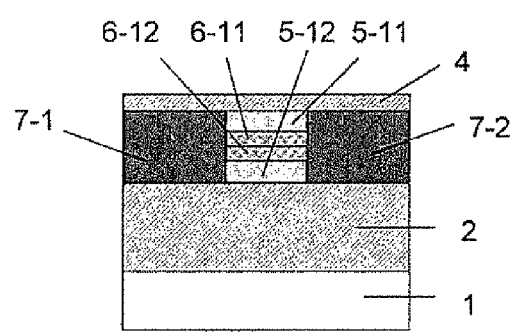
FIG. 24 is a B-B' cross-sectional view of FIG. 22.

FIGS. 22, 23 and 24 show the third embodiment of the present invention. FIG. 22 shows a plan view of a nano-wire field effect transistor in accordance with the present invention independent gates are provided via a gate insulating film on both side surfaces of triangular columnar members. FIG. 23 shows an A-A' cross-sectional view thereof, and FIG. 24 shows a B-B' cross-sectional view thereof.

In FIGS. 22 to 24, 1 denotes a substrate, 2 denotes a buried oxide film, 3-1 and 3-2 denote gate electrodes, 5-11 and 5-12 denote nano-wires each having a triangular cross-section, 6-11 and 6-12 denote gate insulator films, and 7-1 and 7-2 denote source-drain regions.

A fabrication process of the third embodiment is basically the same as that of the first embodiment, but the following two points.
(1) First, during electron beam lithography of the above paragraph 0018, the width W of the resist mask 21 is precisely controlled according to the thickness H of the SOI layer, that is, the width of the resist mask should be larger than H/tan 55° so as to connect the apexes of the upper and the lower nano-wires each with a triangular cross-section each other at the center of the SOI. The width of this connection region is precisely adjusted by controlling the time of orientation dependent wet etching in the above paragraph 0020 so that the silicon in the connection region completely changes into an oxide film during the process for forming the gate oxide film.
(2) Then, after forming the gate electrode in the above paragraph 0022, a CVD oxide film is deposited, and a gate separation process is performed by using a CMP (Chemical & Mechanical Polishing) technique or by resist etching back and RIE.

Other processes are similar to those of the first embodiment.

Fourth Embodiment

Figure 25:
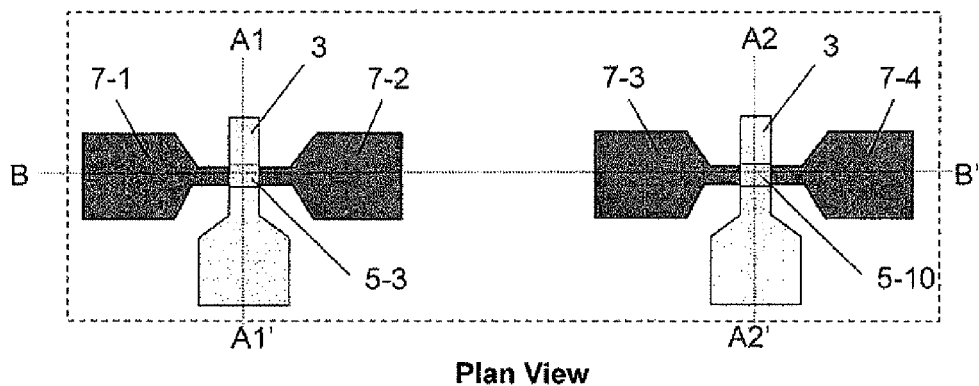
FIG. 25 is a plan view of an integrated circuit including the nano-wire field effect transistor in accordance with the fourth embodiment of the present invention.
Figure 26:
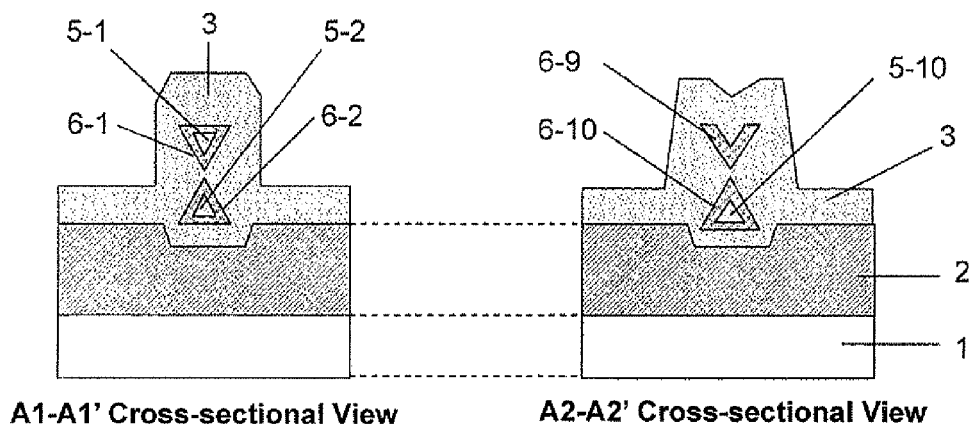
FIG. 26 is A1-A1' and A2-A2' cross-sectional views of FIG. 25.
Figure 27:
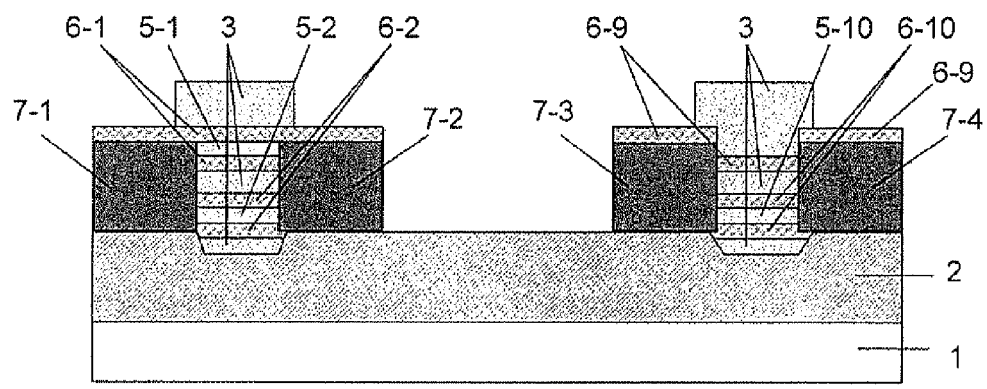
FIG. 27 is a B-B' cross-sectional view of FIG. 25.

FIGS. 25, 26 and 27 show the fourth embodiment of the present invention. FIG. 25 shows a plan view of an integrated circuit in accordance with the present invention, where a nano-wire field effect transistor having two triangular columnar members configuring the nano-wire channels is used as a PMOS, whereas a nano-wire field effect transistor with the upper triangular columnar member removed by etching is used as an NMOS. FIG. 26 shows A1-A1' and A2-A2' cross-sectional views thereof, and FIG. 27 shows a B-B' cross-sectional view thereof.

In FIGS. 25 to 27, 1 denotes a substrate, 2 denotes a buried oxide film, 3 denotes a gate electrode, 5-1, 5-2, and 5-10 denote nano-wires each having a triangular cross-section, 6-1, 6-2, 6-9, and 6-10 denote gate insulator films, and 7-1, 7-2, 7-3, and 7-4 denote source-drain regions.

A fabrication process of the fourth embodiment is basically the same as that of the first embodiment, but the following two points.
(1) In the ion implantation process in the above paragraph 0017, B or $BF_2+$ is implanted in the source-drain regions 7-1 and 7-2 of the nano-wire field effect transistor having a pair of nano-wires each having a triangular cross-section arranged one above the other whereas P or As is implanted in the source-drain regions 7-3 and 7-4 of the nano-wire field effect transistor which lacks the upper nano-wire having a triangular cross-section.
(2) After forming the gate electrode in the above paragraph 0022, the region of the nano-wire field effect transistor having a pair of nano-wires each having a triangular cross-section arranged one above the other is protected by a thick resist film, and then another resist with low viscosity is coated with high speed. An etching back of the resist is performed by using an oxygen plasma, until a protruding head of intersecting part between the nano-wires and the gate electrode is opened. In the following step, the gate electrode, the oxide film and the nano-wire in the upper part are successively etched by RIE with the etching gas species changed accordingly. Finally, the resist is removed by an aqueous solution including sulfuric acid and hydrogen peroxide, and a CVD oxide film is deposited as a protection film. Through these processes, fabrication of a nano-wire field effect transistor with a nano-wire having a triangular cross-section in which an upper nano-wire is etched off and only a lower nano-wire remains is completed.

Other processes are similar to those of the first embodiment.

Fifth Embodiment

Figure 28:
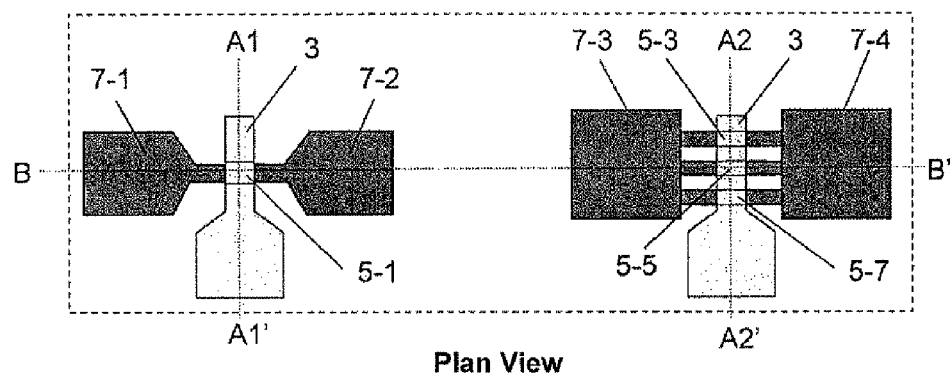
FIG. 28 is a plan view of an integrated circuit including the nano-wire field effect transistor in accordance with the fifth embodiment of the present invention.
Figure 29:
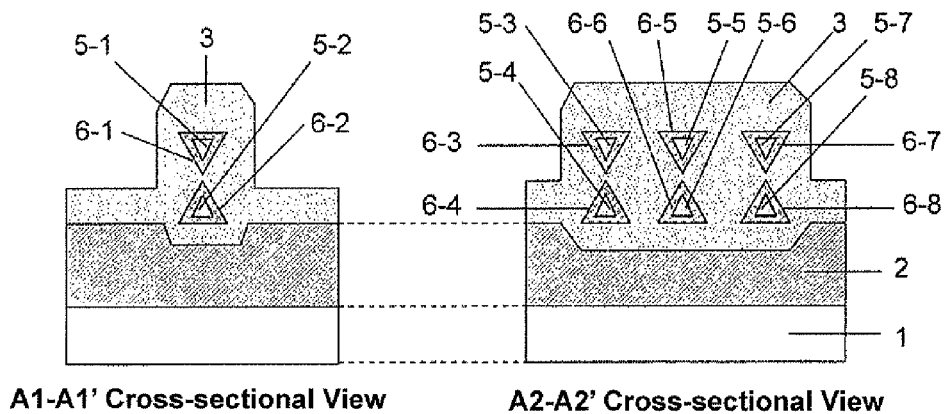
FIG. 29 is A1-A1' and A2-A2' cross-sectional views of FIG. 28.
Figure 30:
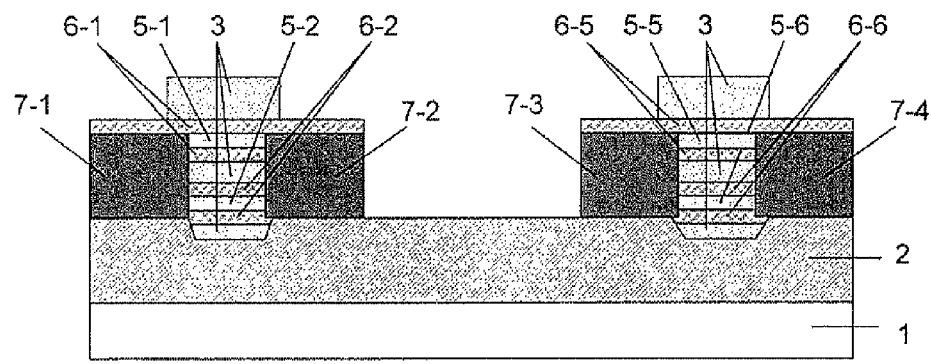
FIG. 30 is a B-B' cross-sectional view of FIG. 28.

FIGS. 28, 29 and 30 show the fifth embodiment of the present invention. FIG. 28 shows a plan view of an integrated circuit in accordance with the present invention, where a nano-wire field effect transistor having two triangular columnar members configuring the nano-wires and a nano-wire field effect transistor where a plurality of pairs of triangular columnar members are arranged in parallel are mixed. FIG. 29 shows A1-A1' and A2-A2' cross-sectional views thereof, and FIG. 30 shows a B-B' cross-sectional view thereof.

In FIGS. 28 to 30, 1 denotes a substrate, 2 denotes a buried oxide film, 3 denotes a gate electrode, 5-1, 5-2, 5-3, 5-4, 5-5, 5-6, 5-7, and 5-8 denote nano-wires each having a triangular cross-section, 6-1, 6-2, 6-3, 6-4, 6-5, 6-6, 6-7, and 6-8 denote gate insulator films, and 7-1, 7-2, 7-3, and 7-4 denote source-drain regions.

A fabrication process of the fifth embodiment is basically the same as that of the first embodiment. A different point is that two kinds of resist patterns are simultaneously drawn for two types of nano-wire field effect transistors during the electron beam lithography in the above paragraph 0018. Other processes are similar to those of the first embodiment.

Sixth Embodiment

Figure 31:
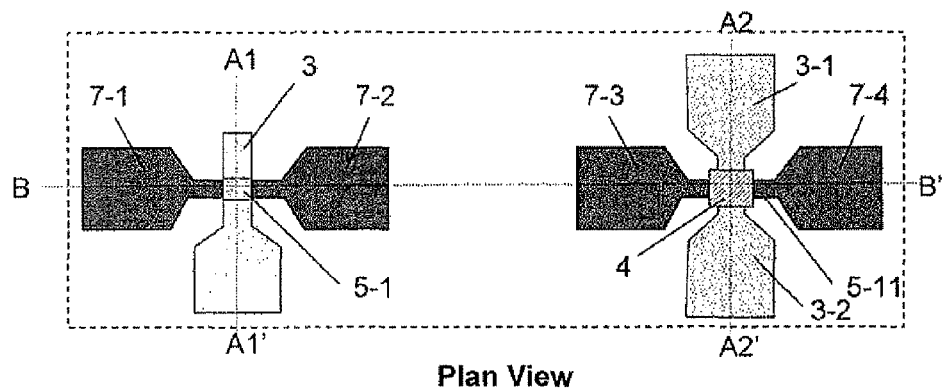
FIG. 31 is a plan view of an integrated circuit including the nano-wire field effect transistor in accordance with the sixth embodiment of the present invention.
Figure 32:
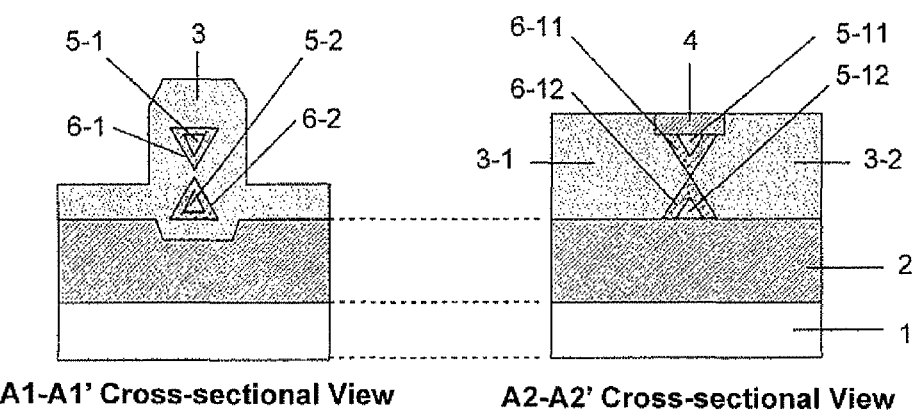
FIG. 32 is A1-A1' and A2-A2' cross-sectional views of FIG. 31.
Figure 33:
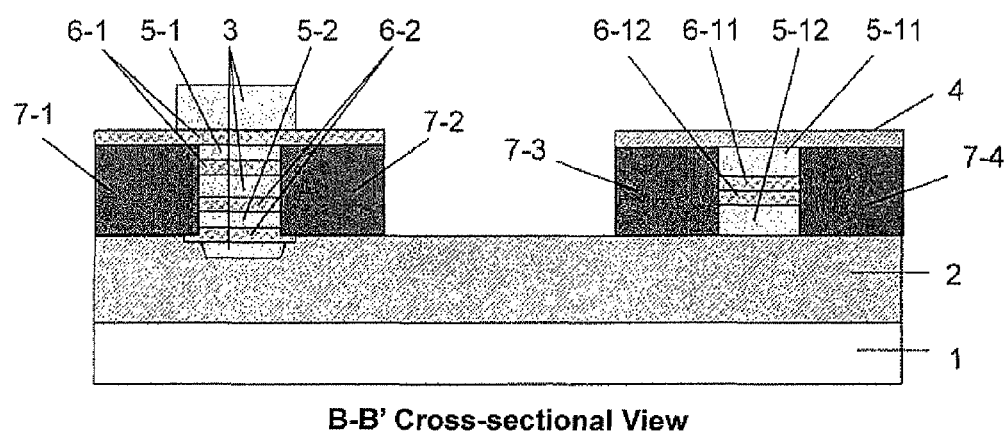
FIG. 33 is a B-B' cross-sectional view of FIG. 31.
Figure 34:
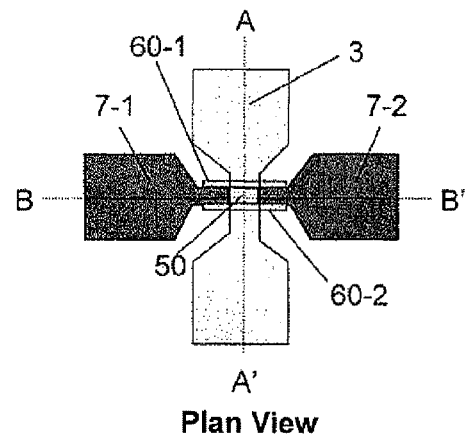
FIG. 34 is a plan view of the conventional fin type double gate MOS field effect transistor.
Figure 35:
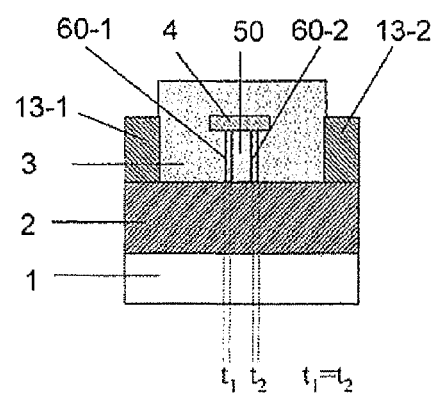
FIG. 35 is an A-A' cross-sectional view of FIG. 34.
Figure 36:
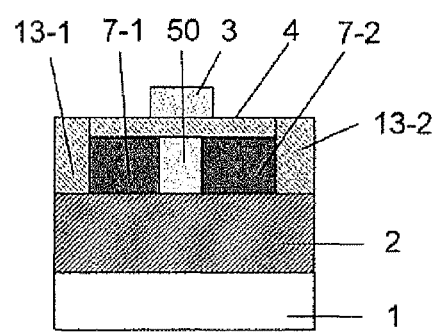
FIG. 36 is a B-B' cross-sectional view of FIG. 34.
Figure 37:
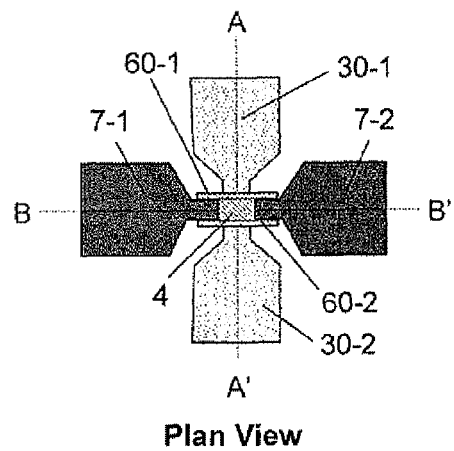
FIG. 37 is a plan view of the conventional separate gate four terminal Fin type double gate MOS field effect transistor having a symmetrical thickness of a gate insulating film.
Figure 38:
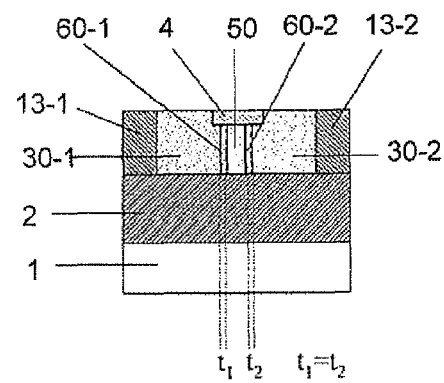
FIG. 38 is an A-A' cross-sectional view of FIG. 37.
Figure 39:
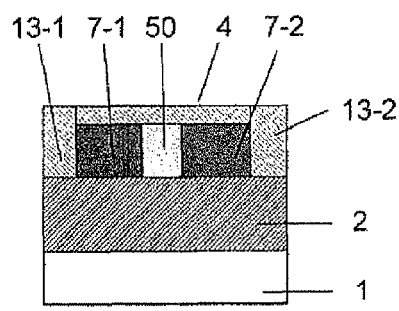
FIG. 39 is a B-B' cross-sectional view of FIG. 37.
Figure 40:
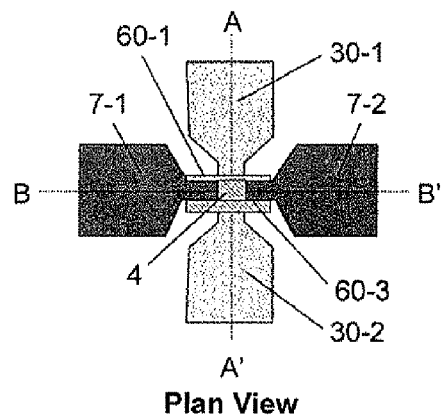
FIG. 40 is a plan view of the conventional separate gate four terminal fin type double gate MOS field effect transistor having an asymmetrical thickness of a gate insulating film.
Figure 41:
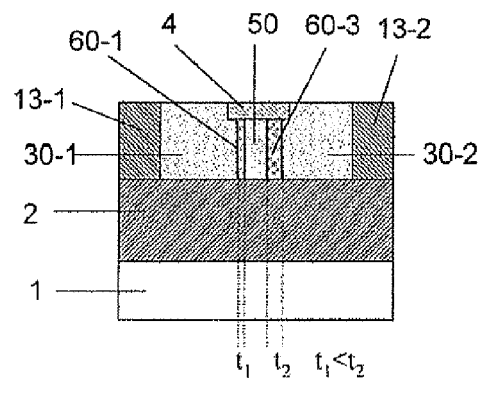
FIG. 41 is an A-A' cross-sectional view of FIG. 40.
Figure 42:
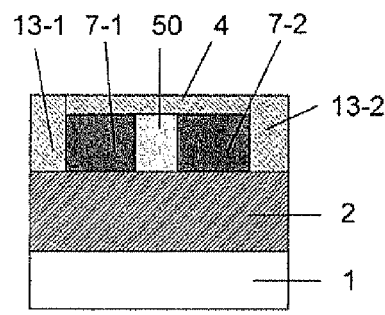
FIG. 42 is a B-B' cross-sectional view of FIG. 40.
Figure 43:
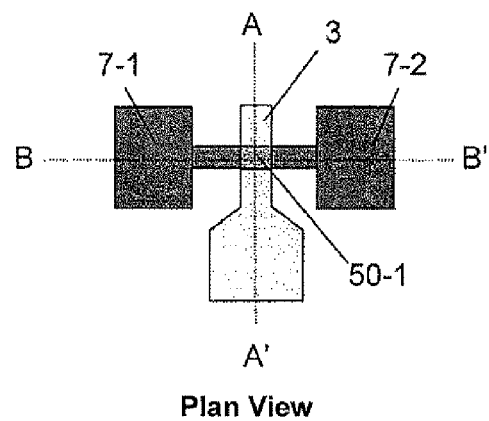
FIG. 43 is a plan view of the conventional nano-wire field effect transistor having a circular cross-section.
Figure 44:
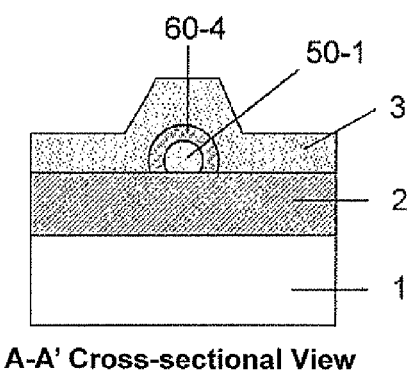
FIG. 44 is an A-A' cross-sectional view of FIG. 43.
Figure 45:
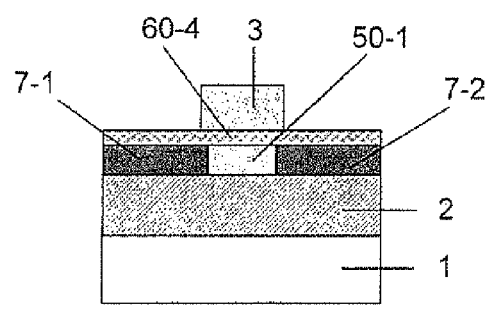
FIG. 45 is a B-B' cross-sectional view of FIG. 43.
Figure 46:
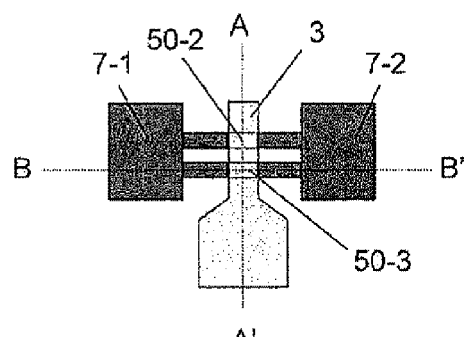
FIG. 46 is a plan view of the conventional nano-wire field effect transistor having laterally arranged two nano-wires each with a circular cross-section.
Figure 47:
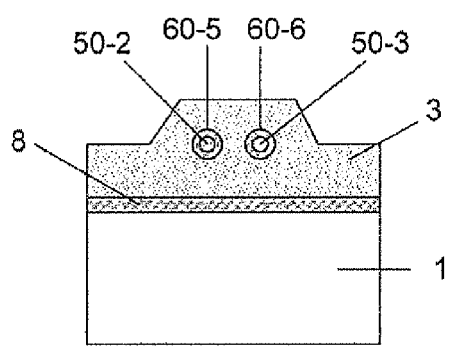
FIG. 47 is an A-A' cross-sectional view of FIG. 46.
Figure 48:
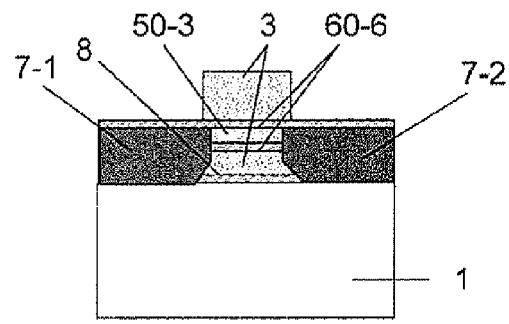
FIG. 48 is a B-B' cross-sectional view of FIG. 46.

FIGS. 31, 32 and 33 show the sixth embodiment of the present invention. FIG. 31 shows a plan view of an integrated circuit in accordance with the present invention, where a nano-wire field effect transistor having two triangular columnar members is used as a PMOS, whereas a nano-wire field effect transistor where two triangular columnar members are connected with each other at their apexes via an insulator film and the gate electrodes on both sides of the channel are separated physically and isolated electrically to be independently controlled is used as an NMOS. FIG. 32 shows A1-A1' and A2-A2' cross-sectional views thereof, and FIG. 33 shows a B-B' cross-sectional view thereof.

In FIGS. 31 to 33, 1 denotes a substrate, 2 denotes a buried oxide film, 3, 3-1, and 3-2 denote gate electrodes, 5-1, 5-2, 5-11, and 5-12 denote nano-wires each having a triangular cross-section, 6-1, 6-2, 6-11, and 6-12 denote gate insulator films, and 7-1, 7-2, 7-3, and 7-4 denote source-drain regions.

A fabrication process of the sixth embodiment is basically the same as that of the first embodiment, but the following two points.
(1) During the electron beam lithography process in the above paragraph 0018, the width of the resist mask for the nano-wire field effect transistor with the separate gates is precisely controlled. The etching time of the orientation dependent wet etching in the above paragraph 0020 is controlled precisely.
(2) After forming the gate electrode in the above paragraph 0022, the region where gates are not separated is protected by a thick resist film, and resist with low viscosity is coated with high speed. Then the gates are selectively separated by etching back of the resist and RIE.

Other processes are similar to those of the first embodiment.

In the above first to sixth embodiments, a nano-wire field effect transistor including two nano-wires and an integrated circuit including the transistor are demonstrated. However, a nano-wire field effect transistor including an even number more than four of nano-wires arranged one above the other and an integrated circuit including such a transistor can be fabricated by using an SOI substrate having more than two of SOI layers and buried oxide films on the surface. In such a case, a current drivability will be improved.

EXPLANATION TO SYMBOLS

1: substrate
2: buried oxide film
3, 3-1, 3-2: gate electrode
4: insulating film
5, 5-1, 5-2, 5-3, 5-4, 5-5, 5-6, 5-7, 5-8, 5-10, 5-11, 5-12: nano-wire having a triangular cross-section
6-1, 6-2, 6-3, 6-4, 6-5, 6-6, 6-7, 6-8, 6-9, 6-10, 6-11, 6-12: gate insulator film
7-1, 7-2, 7-3, 7-4: source-drain region
9: (100) silicon crystal layer
10: oxide film
11: oxide film
11-1: hard mask
13-1, 13-2: insulating film
20, 21: resist pattern
22, 23: gap
24: resist pattern
30: gate electrode material
30-1, 30-2: gate electrode
50: Fin channel having a rectangular cross-section
50-1, 50-2, 50-3: nano-wire having a circular cross-section
60-1, 60-2, 60-3, 60-4, 60-5, 60-6: gate insulator film

The invention claimed is:

1. A nano-wire field effect transistor, comprising:
an even number of triangular columnar members, configuring the nano-wires and being made from a silicon crystal, arranged one above the other on an SOI substrate having a (100) surface orientation in such a way that ridge lines of the triangular columnar members face through an insulator;
a gate electrode around the triangular columnar members; and
a gate insulator film around each triangular columnar member and separating each triangular columnar member from the gate electrode.

2. The nano-wire field effect transistor in accordance with claim 1, wherein independent gate electrodes are provided on opposing sides of the triangular columnar members, and separated from the triangular columnar members by the gate insulator films.

3. The nano-wire field effect transistor in accordance with claim 1, wherein a side surface of the triangular columnar member has a (111) surface orientation.

4. An integrated circuit including the nano-wire field effect transistor in accordance with claim 1.

5. The nano-wire field effect transistor in accordance with claim 1, wherein the gate insulator films and the triangular columnar members have a triangular shape in cross-section.

6. An integrated circuit comprising:
a first nano-wire field effect transistor, comprising an even number of triangular columnar members, configuring the nano-wires and being made from a silicon crystal, arranged one above the other on an SOI substrate having a (100) surface orientation in such a way that ridge lines of the triangular columnar members face through an insulator; and
a second nano-wire field effect transistor in the form of said first nano-wire field effect transistor which lacks an upper triangular columnar member among the even number of triangular columnar members configuring the nano-wires.

* * * * *